(12) United States Patent
Baudendistel et al.

(10) Patent No.: US 6,972,560 B2
(45) Date of Patent: Dec. 6, 2005

(54) METHOD FOR DETECTING A CHANGE IN PERMEABILITY OF A MAGNETOSTRICTIVE OBJECT

(75) Inventors: Thomas A. Baudendistel, Farmersville, OH (US); Robert J. Disser, Dayton, OH (US); Curtis Cyran, Dayton, OH (US)

(73) Assignee: Delphi Technologies, Inc., Troy, MI (US)

( * ) Notice: Subject to any disclaimer, the term of this patent is extended or adjusted under 35 U.S.C. 154(b) by 110 days.

(21) Appl. No.: 10/420,496

(22) Filed: Apr. 22, 2003

(65) Prior Publication Data

US 2004/0212362 A1    Oct. 28, 2004

(51) Int. Cl.[7] ............................. G01B 7/24; G01R 33/18
(52) U.S. Cl. ....................... 324/209; 73/799; 73/862.69
(58) Field of Search ................................ 324/228, 232, 324/233, 239, 243, 209, 181, 182; 336/181, 336/182, 183; 73/779, 862.69, 862.68

(56) References Cited

U.S. PATENT DOCUMENTS

| | | | |
|---|---|---|---|
| 2,557,393 A * | 6/1951 | Rifenbergh ............ 73/862.333 |
| 3,866,462 A * | 2/1975 | Fraudin .................... 73/779 |
| 4,777,436 A | 10/1988 | Fiori, Jr. |
| 4,920,806 A * | 5/1990 | Obama et al. ............... 73/779 |
| 5,027,691 A | 7/1991 | Kennedy |
| 5,041,791 A | 8/1991 | Ackerman et al. |
| 5,194,805 A * | 3/1993 | Nakajima et al. ...... 324/207.16 |
| 5,303,595 A * | 4/1994 | Shoji et al. ................ 73/728 |
| 5,336,997 A | 8/1994 | Anim-Appiah et al. |
| 5,349,868 A * | 9/1994 | Shoji et al. .................. 73/728 |
| 5,432,444 A * | 7/1995 | Yasohama et al. .......... 324/240 |
| 5,501,417 A | 3/1996 | Capan |
| 5,542,304 A * | 8/1996 | Sasada et al. .......... 73/862.333 |
| 5,565,836 A * | 10/1996 | Groehl et al. ............... 336/225 |
| 5,608,318 A | 3/1997 | Yasui |
| 5,628,478 A | 5/1997 | McConnel et al. |
| 6,101,879 A | 8/2000 | Shirai et al. |
| 6,208,132 B1 | 3/2001 | Kliman et al. |
| 6,345,544 B1 * | 2/2002 | Mizuno et al. .......... 73/862.69 |
| 6,481,659 B1 | 11/2002 | Ashtiani et al. |
| 6,547,043 B2 | 4/2003 | Card |
| 6,637,557 B2 | 10/2003 | Oliver et al. |
| 6,664,783 B1 * | 12/2003 | Baril et al. ................. 324/209 |
| 2001/0054896 A1 * | 12/2001 | Mednikov et al. .......... 324/225 |
| 2002/0179250 A1 | 12/2002 | Veltrop et al. |

* cited by examiner

*Primary Examiner*—Bot Ledynh
(74) *Attorney, Agent, or Firm*—Michael D. Smith

(57) ABSTRACT

A method for detecting a change in permeability of a magnetostrictive object due to a change in strain. At least one first coil and at least one second coil are obtained and positioned such that magnetic flux lines induced by an electric current in the first coil(s) pass through at least one portion of the object in a direction substantially parallel to the strain direction, such that magnetic flux lines induced by an electric current in the second coil(s) pass through at least one portion of the object in a direction substantially parallel to the strain direction, and such that any electromagnetic interference sensed by the first coil(s) is sensed oppositely by the second coil(s). The total inductance of the positioned first and second coil(s) is measured over time. A change in permeability of the object is detected from a change in the measured total inductance over time.

20 Claims, 1 Drawing Sheet

METHOD FOR DETECTING A CHANGE IN PERMEABILITY OF A MAGNETOSTRICTIVE OBJECT

TECHNICAL FIELD

The present invention relates generally to magnetic permeability, and more particularly to a method for detecting a change in permeability of a magnetostrictive object due to a change in strain in the object.

BACKGROUND OF THE INVENTION

Conventional methods for determining a change in permeability of a magnetostrictive object due to a change in strain in the object include using an inductive coil. The coil is positioned relative to the object such that magnetic flux lines induced by an alternating electric current in the coil pass through the object in a direction substantially parallel to the strain direction. The inductance of the coil is measured over time. A change in permeability of the object is detected or determined from a change in the measured inductance over time. The coil also senses electromagnetic interference from sources outside the object being measured such as from nearby motors and electronic equipment when the object is located in a magnetically noisy environment. Such magnetic noise sensed by the coil leads to an inaccurate determination of a change in permeability of the object. A conventional approach to reducing such magnetic noise when detecting a change in permeability of the object is to install magnetic shielding which adds to the cost and space requirements for making such measurements.

What is needed is an improved method for detecting a change in permeability of a magnetostrictive object due to a change in strain in the object.

SUMMARY OF THE INVENTION

A first method of the invention is for detecting a change in permeability of a magnetostrictive object due to a change in strain in the object along a strain direction and includes steps a) through e). Step a) includes obtaining at least one first coil having a first number of total turns. Step b) includes obtaining at least one second coil having a second number of total turns. Step c) includes positioning the at-least-one first and second coils relative to the object such that magnetic flux lines induced by an electric current in the at-least-one first coil pass through at least one portion of the object in a direction substantially parallel to the strain direction, such that magnetic flux lines induced by an electric current in the at-least-one second coil pass through at least one portion of the object in a direction substantially parallel to the strain direction, and such that any electromagnetic interference sensed by the at-least-one first coil is sensed oppositely by the at-least-one second coil; Step d) includes measuring the total inductance of the at-least-one first and second coils over time. Step e) includes detecting a change in permeability of the object from a change in the measured total inductance over time.

A second method of the invention is for detecting a change in permeability of a magnetostrictive object due to a change in strain in the object along a strain direction and includes steps a) through e). Step a) includes obtaining a first coil having turns. Step b) includes obtaining a second coil having the same number of turns as the first coil, wherein the second coil is connected in series to the first coil, and wherein the turns of the second coil are wound opposite in direction to the turns of the first coil; Step c) includes positioning the first and second coils relative to the object such that magnetic flux lines induced by an electric current in the first coil pass through a first portion of the object in a direction substantially parallel to the strain direction, such that magnetic flux lines induced by the same electric current in the second coil pass through a different second portion of the object in a direction substantially parallel to the strain direction, and such that any electromagnetic interference sensed by the first coil is sensed oppositely by the second coil. Step d) includes measuring the total inductance of the first and second coils over time. Step e) includes detecting a change in permeability of the object from a change in the measured total inductance over time.

A third method of the invention is for detecting a change in permeability of a magnetostrictive component of a vehicle strain sensor due to a change in strain in the component along a strain direction and includes steps a) through e). Step a) includes obtaining a first coil having turns. Step b) includes obtaining a second coil having the same number of turns as the first coil, wherein the second coil is connected in series to the first coil, and wherein the turns of the second coil are wound opposite in direction to the turns of the first coil. Step c) includes positioning the first and second coils relative to the component such that magnetic flux lines induced by an electric current in the first coil pass through at first portion of the component in a direction substantially parallel to the strain direction, such that magnetic flux lines induced by the same electric current in the second coil pass through a different second portion of the component in a direction substantially parallel to the strain direction, and such that any electromagnetic interference sensed by the first coil is sensed oppositely by the second coil. Step d) includes measuring the total inductance of the first and second coils over time. Step e) includes detecting a change in permeability of the component from a change in the measured total inductance over time.

Several benefits and advantages are derived from one or more of the methods of the invention. By using at least one first coil and at least one second coil which together substantially cancel out electromagnetic interference, a more accurate detection of a change in permeability of a magnetostrictive object due to a change in strain in the object can be made without the need for conventional magnetic shielding. In one example, the change in permeability is determined (and not merely detected) from the change in the measured total inductance over time, and the strain in the object is determined from the change in inductance.

DESCRIPTION OF THE PREFERRED EMBODIMENT

Figure 1:
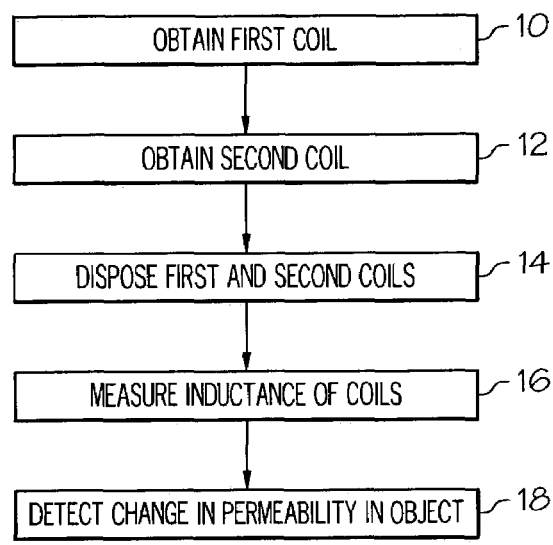
FIG. 1 is a flow chart of a first method for detecting a change in permeability of a magnetostrictive object due to a change in strain in the object.

A first method of the invention, shown in FIG. 1, is for detecting a change in permeability (i.e., magnetic permeability) of a magnetostrictive object due to a change in strain in the object along a strain direction. The first method includes steps a) through e). Step a) is labeled as "Obtain First Coil" in block 10 of FIG. 1. Step a) includes obtaining at least one first coil having a first number of total turns. Step b) is labeled as "Obtain Second Coil" in block 12 of FIG. 1. Step b) includes obtaining at least one second coil having a second number of total turns. Step c) is labeled as "Dispose First And Second Coils" in block 14 of FIG. 1. Step c) includes disposing the at-least-one first and second coils relative to the object such that magnetic flux lines induced by an electric current in the at-least-one first coil pass through at least one portion of the object in a direction substantially parallel to the strain direction, such that magnetic flux lines induced by an electric current in the at-least-one second coil pass through at least one portion of the object in a direction substantially parallel to the strain direction, and such that any electromagnetic interference sensed by the at-least-one first coil is sensed oppositely by the at-least-one second coil. Step d) is labeled as "Measure Inductance Of Coils" in block 16 of FIG. 1. Step d) includes measuring the total inductance of the disposed at-least-one first and second coils over time. By "measuring . . . over time" is meant measuring at least at two different times. Step e) is labeled as "Detect Change In Permeability in Object" in block 18 of FIG. 1. Step e) includes detecting a change in permeability of the object from a change in the measured total inductance over time.

It is noted that step d) can be carried out by using one of the inductance measuring methods known to those skilled in the art. In one variation of the first method, step d) compensates for any difference in the first and second numbers of total turns as is within the level of skill of the artisan. In the same or a different variation, step d) includes compensating for any temperature change over time as is also within the level of skill of the artisan.

In one enablement of the first method, the at-least-one first coil consists of a single first coil. In one variation, the at-least-one second coil consists of a single second coil. In one construction, the second number of total turns equals the first number of total turns.

In one example of the first method, the magnetic flux lines induced by the electric current in the first coil pass through a first portion of the object, and the magnetic flux lines induced by the electric current in the second coil pass through a different second portion of the object. In one variation, the magnetic flux lines pass through the first and second portions of the object in the same direction. In a different variation, the magnetic flux lines pass through the first and second portions of the object in opposite directions.

In one elaboration of the first method, the second coil is connected in series to the first coil. In one variation, step d) includes measuring the total inductance between the unconnected ends of the first and second coils. In a different variation, step d) includes measuring a first inductance of the first coil and measuring a second inductance of the second coil. In a different elaboration of the first method, the second coil is not connected to the first coil.

In one variation of the first method, the electric current in the second coil is substantially equal to the electric current in the first coil. Step d) includes compensating for unequal electric currents as is within the level of skill of the artisan. In one modification, the electric current is alternating electric current. In one variation, the alternating electric current is a sinusoidally alternating electric current. Other types of alternating electric current are left to the artisan.

In one arrangement of the first method, the first and second coils are substantially circular coils and are substantially coaxially aligned. In one design, the first and second coils have substantially the same inner and outer coil radii and are longitudinally spaced apart. In a different design, the first and second coils are substantially radially aligned and are radially spaced apart. In a different arrangement, the first and second coils have an annular square or an annular triangular shape. Other shapes are left to the artisan. In one choice of materials, the first and second coils are wound from insulated copper wire.

In one extension of the first method, step e) includes determining (i.e., calculating) the change in permeability as is within the level of skill of the artisan. In one variation, the first method also includes the step of determining the strain in the object from the determined change in permeability of the object, as can be done by the artisan using conventional mathematical and/or empirical calibration techniques.

A second method of the invention is for detecting a change in permeability of a magnetostrictive object due to a change in strain in the object along a strain direction and includes steps a) through e). Step a) includes obtaining a first coil having a plurality of turns. Step b) includes obtaining a second coil having the same plurality of turns as the first coil, wherein the second coil is connected in series to the first coil, and wherein the turns of the second coil are wound opposite in direction to the turns of the first coil. Step c) includes disposing the first and second coils relative to the object such that magnetic flux lines induced by an electric current in the first coil pass through a first portion of the object in a direction substantially parallel to the strain direction, such that magnetic flux lines induced by the same electric current in the second coil pass through a different second portion of the object in a direction substantially parallel to the strain direction, and such that any electromagnetic interference sensed by the first coil is sensed oppositely by the second coil. Step d) includes measuring the total inductance of the disposed first and second coils over time. Step e) includes detecting a change in permeability of the object from a change in the measured total inductance over time.

A third method of the invention is for detecting a change in permeability of a magnetostrictive component of a vehicle strain sensor due to a change in strain in the component along a strain direction and includes steps a) through e). Step a) includes obtaining a first coil having a plurality of turns. Step b) includes obtaining a second coil having the same plurality of turns as the first coil, wherein the second coil is connected in series to the first coil, and wherein the turns of the second coil are wound opposite in direction to the turns of the first coil. Step c) includes disposing the first and second coils relative to the component such that magnetic flux lines induced by an electric current in the first coil pass through at first portion of the component in a direction substantially parallel to the strain direction, such that magnetic flux lines induced by the same electric current in the second coil pass through a different second portion of the component in a direction substantially parallel to the strain direction, and such that any electromagnetic interference sensed by the first coil is sensed oppositely by the second coil. Step d) includes measuring the total inductance of the disposed first and second coils over time. Step e) includes detecting a change in permeability of the component from a change in the measured total inductance over time.

Figure 2:
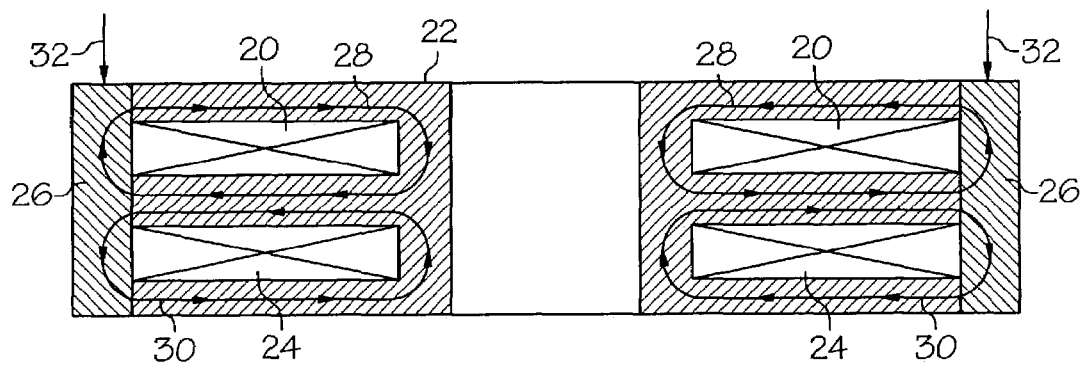
FIG. 2 is a schematic cross-sectional view of a first embodiment of apparatus which can be used in the performance of the first method.

A first embodiment of apparatus which can be used to carry out any of the above methods is shown schematically in FIG. 2. The circular first coil 20 is disposed in a first recess of an optional ferromagnetic bobbin 22, and the circular second coil 24 is disposed in a second recess of the ferromagnetic bobbin 22. The magnetostrictive object 26 in this embodiment is a circular ring. The outer circumference of the first and second coils 20 and 24 is disposed in contact with the inner circumference of the ring. In one choice of materials, the object 26 consists essentially of nickel. Other choices of materials for the ferromagnetic object 26 are left to the artisan. The first and second coils 20 and 24 are connected in series (such connection being omitted from FIG. 2 for clarity). The first coil 20 has turns wound in an opposite direction to the turns of the second coil 24. The magnetic flux lines 28 induced by the alternating electric current in the first coil 20 are shown as a single loop with arrowheads indicating the direction of the magnetic flux lines 28. Likewise, the magnetic flux lines 30 induced by the alternating electric current in the second coil 24 are shown as a single loop with arrowheads indicating the direction of the magnetic flux lines 30. Arrow 32 indicates the strain direction. The strain direction is the direction of a force being applied to the object, it being understood that an equal counterforce is also being applied to the object. It is noted that the magnetic flux lines 28 pass through a portion of the magnetostrictive object 26 parallel to (and in the same direction as) the strain direction 32, and that the magnetic flux lines 30 pass through a different second portion of the magnetostrictive object 26 parallel to (and in the opposite direction to) the strain direction 32. It is noted that because the magnetic flux lines 28 and 30 of the first and second coils 20 and 24 run in opposite directions, any electromagnetic interference encountered by the first coil 20 will be essentially cancelled by the second coil 24 when the total inductance of the first and second coils 20 and 24 is measured in step d) of any of the methods, as can be understood by those skilled in the art.

Figure 3:
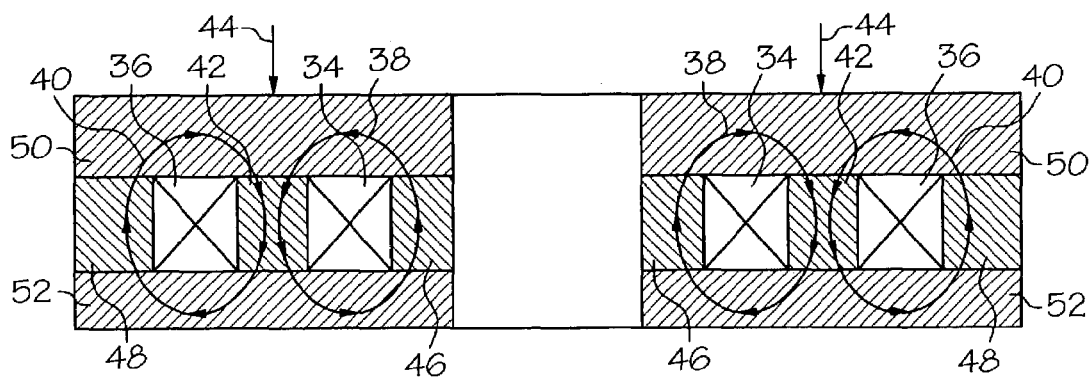
FIG. 3 is a schematic cross-sectional view of a second embodiment of apparatus which can be used in the performance of the first method.

A second embodiment of apparatus which can be used to carry out any of the above methods is shown schematically in FIG. 3. The first coil 34 and the second coil 36 are disposed as shown. The magnetic flux lines 38 of the first coil 34 and the magnetic flux lines 40 of the second coil 36 are shown as loops "running" in opposite directions wherein the magnetic flux lines 38 and 40 pass each pass through a portion of the magnetostrictive object 42 in a direction parallel to (and the same as) the strain direction 44. The apparatus also includes other magnetostrictive rings 46 and 48 and upper and lower steel annular bands 50 and 52 as shown. Still other embodiments of apparatus to carry out any of the above methods are left to the artisan in view of the above teachings.

Several benefits and advantages are derived from one or more of the methods of the invention. By using at least one first coil and at least one second coil which together substantially cancel out electromagnetic interference, a more accurate detection of a change in permeability of a magnetostrictive object due to a change in strain in the object can be made without the need for conventional magnetic shielding. In one example, the change in permeability is determined (and not merely detected) from the change in the measured total inductance over time, and the strain in the object is determined from the change in inductance.

The foregoing description of several methods of the invention has been presented for purposes of illustration. It is not intended to be exhaustive or to limit the invention to the precise forms or procedures disclosed, and obviously many modifications and variations are possible in light of the above teaching. It is intended that the scope of the invention be defined by the claims appended hereto.

What is claimed is:

1. A method for detecting a change in permeability of a magnetostrictive object due to a change in strain in the object along a strain direction comprising the steps of:
   a) obtaining at least one first coil having a coil axis and a first number of total turns;
   b) obtaining at least one second coil having a second number of total turns;
   c) disposing the at-least-one first and second coils relative to the object such that the at-least-one first and second coils are substantially coaxially aligned, such that the object is spaced apart from the coil axis, such that the inductance of each of the at-least-one first and second coils simultaneously changes due to the change in strain in the object, such that magnetic flux lines induced by an electric current in the at-least-one first coil pass through at least one portion of the object in a direction substantially parallel to the strain direction, such that magnetic flux lines induced by an electric current in the at-least-one second coil pass through at least one portion of the object in a direction substantially parallel to the strain direction, and such that any electromagnetic interference sensed by the at-least-one first coil is sensed oppositely by the at-least-one second coil;
   d) measuring the total inductance of the disposed at-least-one first and second coils over time; and
   e) detecting a change in permeability of the object from a change in the measured total inductance over time.

2. The method of claim 1, wherein the object is a component of a vehicle strain sensor.

3. The method of claim 1, wherein step d) compensates for any difference in the first and second numbers of total turns.

4. The method of claim 1, wherein step d) includes compensating for any temperature change over time.

5. The method of claim 1, wherein the at-least-one first coil consists of a single first coil.

6. The method of claim 5, wherein the at-least-one second coil consists of a single second coil.

7. The method of claim 6, wherein the second number of total turns equals the first number of total turns.

8. The method of claim 6, wherein the magnetic flux lines induced by the electric current in the first coil pass through a first portion of the object, and wherein the magnetic flux lines induced by the electric current in the second coil pass through a different second portion of the object.

9. The method of claim 6, wherein the magnetic flux lines pass through the first and second portions of the object in the same direction.

10. The method of claim 6, wherein the magnetic flux lines pass through the first and second portions of the object in opposite directions.

11. The method of claim 6, wherein the second coil is connected in series to the first coil.

12. The method of claim 11, wherein step d) includes measuring the total inductance between the unconnected ends of the first and second coils.

13. The method of claim 6, wherein the second coil is not connected to the first coil.

14. The method of claim 13, wherein the electric current in the second coil is substantially equal to the electric current in the first coil.

15. The method of claim 6, wherein the first and second coils are substantially circular coils and wherein no turn of the second coil is disposed between two adjacent turns of the first coil.

16. The method of claim 15, wherein the first and second coils have substantially the same inner and outer coil radii and are longitudinally spaced apart.

17. A method for detecting a change in permeability of a magnetostrictive object due to a change in strain in the object along a strain direction comprising the steps of:
  a) obtaining at least one first coil having a first number of total turns;
  b) obtaining at least one second coil having a second number of total turns;
  c) disposing the at-least-one first and second coils relative to the object such that the at-least-one first and second coils are substantially coaxially aligned, such that magnetic flux lines induced by an electric current in the at-least-one first coil pass through at least one portion of the object in a direction substantially parallel to the strain direction, such that magnetic flux lines induced by an electric current in the at-least-one second coil pass through at least one portion of the object in a direction substantially parallel to the strain direction, and such that any electromagnetic interference sensed by the at-least-one first coil is sensed oppositely by the at-least-one second coil:
  d) measuring the total inductance of the disposed at-least-one first and second coils over time; and
  e) detecting a change in permeability of the object from a change in the measured total inductance over time, wherein the at-least-one first coil consists of a single first coil, wherein the at-least-one second coil consists of a single second coil, wherein the first and second coils are substantially circular coils, wherein no turn of the second coil is disposed between two adjacent turns of the first coil, and wherein the first and second coils are substantially radially aligned and are radially spaced apart.

18. The method of claim 1, wherein step e) includes determining the change in permeability, and also including the step of determining the strain in the object from the determined change in permeability of the object.

19. A method for detecting a change in permeability of a magnetostrictive object due to a change in strain in the object along a strain direction comprising the steps of:
  a) obtaining a first coil having a coil axis and a plurality of turns;
  b) obtaining a second coil having the same plurality of turns as the first coil, wherein the second coil is connected in series to the first coil, and wherein the turns of the second coil are wound opposite in direction to the turns of the first coil;
  c) disposing the first and second coils relative to the object such that the at-least-one first and second coils are substantially coaxially aligned, such that the object is spaced apart from the coil axis, such that the inductance of each of the at-least-one first and second coils simultaneously changes due to the change in strain in the object, such that magnetic flux lines induced by an electric current in the first coil pass through a first portion of the object in a direction substantially parallel to the strain direction, such that magnetic flux lines induced by the same electric current in the second coil pass through a different second portion of the object in a direction substantially parallel to the strain direction, and such that any electromagnetic interference sensed by the first coil is sensed oppositely by the second coil;
  d) measuring the total inductance of the disposed first and second coils over time; and
  e) detecting a change in permeability of the object from a change in the measured total inductance over time.

20. A method for detecting a change in permeability of a magnetostrictive component of a vehicle strain senor due to a change in strain in the component along a strain direction comprising the steps of:
  a) obtaining a first coil having a coil axis and a plurality of turns;
  b) obtaining a second coil having the same plurality of turns as the first coil, wherein the second coil is connected in series to the first coil, and wherein the turns of the second coil are wound opposite in direction to the turns of the first coil;
  c) disposing the first and second coils relative to the component such that the at-least-one first and second coils are substantially coaxially aligned, such that the object is spaced apart from the coil axis, such that the inductance of each of the at-least-one first and second coils simultaneously changes due to the change in strain in the object, such that magnetic flux lines induced by an electric current in the first coil pass through a first portion of the component in a direction substantially parallel to the strain direction, such that magnetic flux lines induced by the same electric current in the second coil pass through a different second portion of the component in a direction substantially parallel to the strain direction, and such that any electromagnetic interference sensed by the first coil is sensed oppositely by the second coil;
  d) measuring the total inductance of the disposed first and second coils over time; and
  e) detecting a change in permeability of the component from a change in the measured total inductance over time.

* * * * *